(12) United States Patent
Kim et al.

(10) Patent No.: US 10,741,509 B2
(45) Date of Patent: Aug. 11, 2020

(54) ANTENNA MODULE

(71) Applicant: SAMSUNG ELECTRONICS CO., LTD., Suwon-si (KR)

(72) Inventors: Doo Il Kim, Suwon-Si (KR); Dae Kwon Jung, Suwon-Si (KR); Young Sik Hur, Suwon-Si (KR); Yong Ho Baek, Suwon-Si (KR)

(73) Assignee: SAMSUNG ELECTRONICS, LTD., Suwon-si (KR)

( * ) Notice: Subject to any disclaimer, the term of this patent is extended or adjusted under 35 U.S.C. 154(b) by 0 days.

(21) Appl. No.: 16/009,732

(22) Filed: Jun. 15, 2018

(65) Prior Publication Data
US 2019/0279950 A1   Sep. 12, 2019

(30) Foreign Application Priority Data
Mar. 12, 2018   (KR) ......................... 10-2018-0028803

(51) Int. Cl.
*H01L 27/14*   (2006.01)
*H01L 23/66*   (2006.01)
(Continued)

(52) U.S. Cl.
CPC .......... *H01L 23/66* (2013.01); *H01L 23/3114* (2013.01); *H01L 23/5383* (2013.01);
(Continued)

(58) Field of Classification Search
None
See application file for complete search history.

(56) References Cited

U.S. PATENT DOCUMENTS 6,329,949 B1   12/2001   Barnett et al.
7,518,553 B2    4/2009   Zhang et al.
(Continued)

FOREIGN PATENT DOCUMENTS

CN   104851878 A    8/2015
JP   2002-344146 A  11/2002
(Continued)

OTHER PUBLICATIONS

Office Action issued in Japanese Application No. 2018-116273 dated Mar. 19, 2019, with English translation.
(Continued)

*Primary Examiner* — Hung K Vu
(74) *Attorney, Agent, or Firm* — Sughrue Mion, PLLC

(57) ABSTRACT

An antenna module includes a connection member including at least one wiring layer and at least one insulating layer, an antenna package including a plurality of antenna members transmitting or receiving a radio frequency (RF) signal and a plurality of feed vias respectively electrically connected to the plurality of antenna members at one end and respectively electrically connected to a wiring corresponding to the at least one wiring layer at the other end, and positioned on a first surface of the connection member, an integrated circuit (IC) disposed on a second surface of the connection member and electrically connected to the wiring corresponding to the at least one wiring layer to receive an intermediate frequency (IF) signal or baseband signal and transfer an RF signal or receive an RF signal and transfer an IF signal or baseband signal, and a filter filtering an IF signal or a baseband signal.

19 Claims, 18 Drawing Sheets

(51) Int. Cl.
*H01L 23/31* (2006.01)
*H01L 23/538* (2006.01)
*H01L 23/00* (2006.01)
*H01Q 9/04* (2006.01)

(52) U.S. Cl.
CPC ...... *H01L 23/5386* (2013.01); *H01L 23/5389* (2013.01); *H01L 24/20* (2013.01); *H01L 2223/6677* (2013.01); *H01L 2224/214* (2013.01); *H01L 2924/19105* (2013.01); *H01Q 9/0407* (2013.01)

(56) References Cited

U.S. PATENT DOCUMENTS

| | | |
|---|---|---|
| 9,331,030 B1 | 5/2016 | Tsai et al. |
| 2005/0253664 A1 | 11/2005 | Hyvonen |
| 2009/0046029 A1 | 2/2009 | Nagai |
| 2010/0178879 A1* | 7/2010 | Sato .................. H03F 3/195 455/78 |
| 2011/0304012 A1* | 12/2011 | Kim .................. H01L 21/56 257/531 |
| 2015/0061091 A1 | 3/2015 | Seler et al. |
| 2016/0276734 A1 | 9/2016 | Jin |
| 2017/0222316 A1 | 8/2017 | Mizunuma et al. |

FOREIGN PATENT DOCUMENTS

| | | |
|---|---|---|
| JP | 2004-15160 A | 1/2004 |
| JP | 2007-166117 A | 6/2007 |
| JP | 2017-187379 A | 10/2017 |
| KR | 10-2005-0065861 A | 6/2005 |
| KR | 10-2016-0112154 A | 9/2016 |
| WO | 2016/063759 A1 | 4/2016 |

OTHER PUBLICATIONS

Office Action issued in Korean Patent Application No. 10-2018-0028803 dated Dec. 24, 2018, with English tranlsation.

* cited by examiner

ANTENNA MODULE

CROSS-REFERENCE TO RELATED APPLICATION

This application claims the benefit of priority to Korean Patent Application No. 10-2018-0028803 filed on Mar. 12, 2018, in the Korean Intellectual Property Office, the disclosure of which is incorporated herein by reference in its entirety.

TECHNICAL FIELD

The present disclosure relates to an antenna module.

BACKGROUND

Mobile communications data traffic tends to increase rapidly year-by-year. Technological development is actively underway to support rapidly increasing data in real time in wireless networks. For example, receiving and transmitting data for Internet of things (IoT), augmented reality (AR), virtual reality (VR), live VR/AR combined with social network services (SNS), autonomous driving, sync view (real-time image transmission of user's view using compact camera), applications, and the like, require communications (e.g., $5^{th}$-generation (5G) communications, millimeter wave (mmWave) communications, etc.) supporting the exchange of mass amounts of data.

Therefore, mmWave communications including 5G communications have been actively studied and research to allow for the commercialization/standardization of antenna modules to smoothly realize mmWave communications has actively been conducted.

RF signals of high frequency bands (e.g., 24 GHz, 28 GHz, 36 GHz, 39 GHz, 60 GHz, etc.) are easily absorbed in the course of transmissions and lead to loss, so that the quality of communications may be drastically lowered. Therefore, antennas for communications of high-frequency bands require a technical approach different from that of the related art antenna technology, and the development of special technologies such as a separate power amplifier for securing an antenna gain, integrating an antenna and a radio frequency integrated circuit (RFIC), securing effective isotropic radiated power, and the like, may be required.

Traditionally, antenna modules providing a mmWave communications environment use a structure in which an IC and an antenna are disposed on a substrate and are connected by a coaxial cable to meet a high level (e.g., transmit/receive ratio, gain, directivity, etc.) of antenna performance according to high frequencies. This structure, however, may lead to insufficient antenna layout space, limitations on the degree of freedom of an antenna shape, increased interference between the antenna and the IC, and an increase in the size/cost of antenna modules.

SUMMARY

An aspect of the present disclosure may provide an antenna module that may be miniaturized, while securing a high level of antenna performance, through a structure in which an antenna, an integrated circuit (IC), and a filter are effectively integrated.

According to an aspect of the present disclosure, an antenna module may include: a connection member including at least one wiring layer and at least one insulating layer; an antenna package including a plurality of antenna members transmitting or receiving a radio frequency (RF) signal and a plurality of feed vias respectively electrically connected to the plurality of antenna members at one end and respectively electrically connected to a wiring corresponding to the at least one wiring layer at the other end, and positioned on a first surface of the connection member; an integrated circuit (IC) disposed on a second surface of the connection member and electrically connected to the wiring corresponding to the at least one wiring layer to receive an intermediate frequency (IF) signal or a baseband signal and transfer a radio frequency (RF) signal or receive an RF signal and transfer an IF signal or a baseband signal; and a filter disposed outside of the IC and filtering an IF signal or a baseband signal.

According to another aspect of the present disclosure, an antenna module may include: a connection member including at least one wiring layer and at least one insulating layer; an antenna package including a plurality of antenna members transmitting or receiving a radio frequency (RF) signal and a plurality of feed vias respectively electrically connected to the plurality of antenna members at one end and respectively electrically connected to a wiring corresponding to the at least one wiring layer at the other end, and positioned on a first surface of the connection member; an integrated circuit (IC) disposed on a second surface of the connection member and electrically connected to the wiring corresponding to the at least one wiring layer to receive an intermediate frequency (IF) signal or a baseband signal and transfer a radio frequency (RF) signal or receive an RF signal and transfer an IF signal or a baseband signal; a support member disposed on a second surface of the connection member and electrically connected to the wiring corresponding to the at least one wiring layer to allow an IF signal or a baseband signal to pass through the support member; and a filter disposed on the support member.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
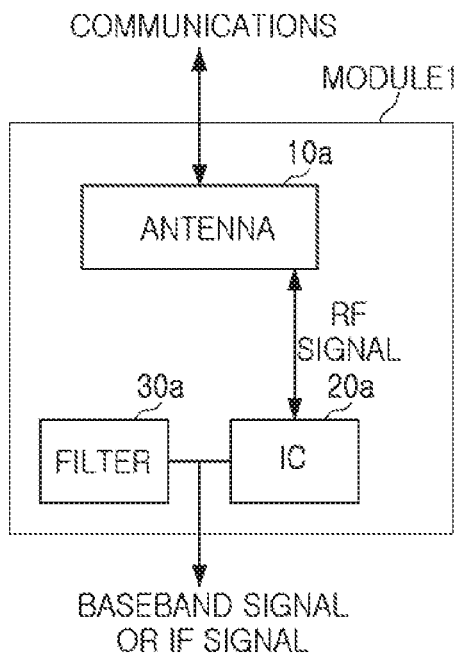
FIG. 1 is a block diagram illustrating an antenna module according to an exemplary embodiment in the present disclosure.

Exemplary embodiments of the present disclosure will now be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the above-mentioned upward and downward directions, and a horizontal direction refers to a direction perpendicular to the above-mentioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

FIG. 1 is a block diagram illustrating an antenna module according to an exemplary embodiment in the present disclosure.

Referring to FIG. 1, an antenna module module1 according to an exemplary embodiment in the present disclosure may have a structure in which an antenna 10a, an IC 20a, and a filter 30a are integrated.

The antenna 10a may remotely receive or transmit a radio frequency (RF) signal and transmit a received RF signal to the IC 20a or receive an RF signal for transmission from the IC 20a. The antenna 10a may include a plurality of antenna members to further enhance antenna performance.

The IC 20a may convert the received RF signal into an intermediate frequency (IF) signal or a baseband signal and transfer the converted IF signal or baseband signal to an IF IC, a baseband IC, or a communications modem disposed outside of the antenna module module1. The IC 20a may convert an IF signal or a baseband signal received from the IF IC, the baseband IC, or the communications modem disposed outside of the antenna module module1 into an RF signal and deliver the converted RF signal to the antenna 10a. Here, a frequency of the RF signal (e.g., 24 GHz, 28 GHz, 36 GHz, 39 GHz, and 60 GHz) may be higher than a frequency of the IF signal (e.g., 2 GHz, 5 GHz, and 10 GHz). Meanwhile, the IC 20a may perform at least some of frequency conversion, amplification, filtering, phase control, and power generation to generate a converted signal.

The filter 30a may filter the converted IF signal or the baseband signal from the IC 20a and may be disposed outside of the IC 20a. For example, the filter 30a may be a bandpass filter having a predetermined pass band (e.g., 800

MHz and 2.4 GHz) or a highpass filter or a lowpass filter having a predetermined cutoff frequency (e.g., 12 GHz and 15 GHz).

According to the filtering at the filter 30a, noise included in the IF signal or the baseband signal may be reduced. Since noise contained in the RF signal is dependent on the noise contained in the IF signal or the baseband signal, the noise contained in the RF signal may decrease together with the reduction in the noise contained in the IF signal or baseband signal.

Accordingly, the antenna module module1 may easily meet the requirement specification of noise characteristics, even without using an additional filter for filtering the RF signal. Accordingly, the antenna module module1 may reduce a size by as much as a space to be occupied by the additional filter for filtering the RF signal.

Further, when the antenna 10a includes a plurality of antenna members for antenna performance (e.g., transmission/reception ratio, gain, linearity, etc.), the amount of additional filters for filtering RF signals may need to be increased, and here, the use of the filter 30a in the antenna module module1 may eliminate additional filters respectively corresponding to the plurality of antenna members. Accordingly, the antenna module module1 may be reduced in size by reducing the size of the space to be occupied by the plurality of filters, while ensuring antenna performance.

Figure 2:
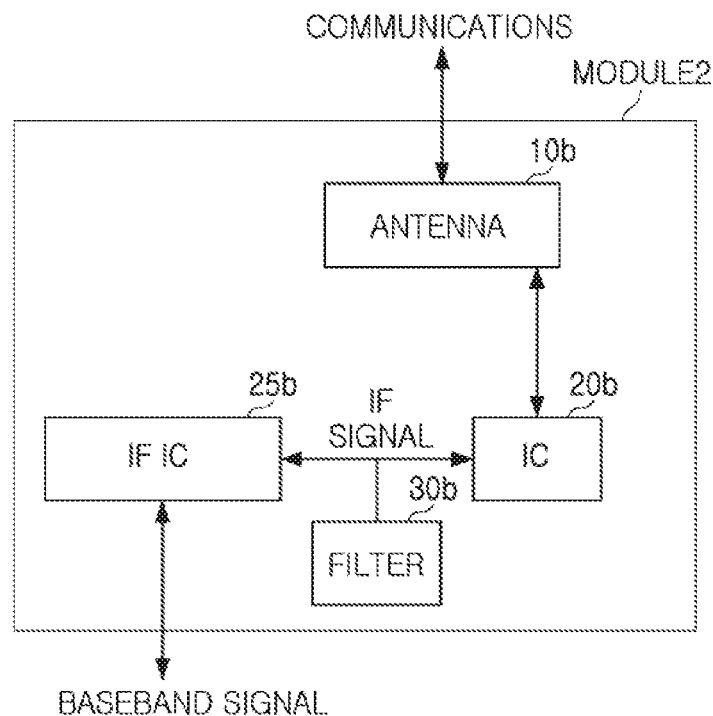
FIG. 2 is a block diagram illustrating a structure in which an antenna module according to an exemplary embodiment in the present disclosure may further include an IF IC.

FIG. 2 is a block diagram illustrating a structure in which an antenna module according to an exemplary embodiment in the present disclosure may further include an IF IC.

Referring to FIG. 2, an antenna module module2 according to an exemplary embodiment in the present disclosure may have a structure in which an antenna 10b, an IC 20b, an IF IC 25b, and a filter 30b are integrated.

The antenna 10b may remotely receive or transmit an RF signal and transmit a received RF signal to the IC 20b or receive an RF signal for transmission from the IC 20b. The antenna 10b may further improve antenna performance by including a plurality of antenna members.

The IC 20b may convert the received RF signal into an IF signal and transmit the converted IF signal to the IF IC 25b. The IC 20b may convert the IF signal received from the IF IC 25b into an RF signal and transmit the converted RF signal to the antenna 10b. Here, a frequency of the RF signal (e.g., 24 GHz, 28 GHz, 36 GHz, 39 GHz, and 60 GHz) is higher than a frequency of the IF signal (e.g., 2 GHz, 5 GHz, and 10 GHz).

The IF IC 25b may convert the received IF signal into a baseband signal and transfer the converted baseband signal to a baseband IC or a communications modem positioned outside the antenna module module2. The IF IC 25b may convert the baseband signal received from the baseband IC or the communications modem positioned outside the antenna module module2 into an IF signal and transfer the converted IF signal to the IC 20b.

The filter 30b may filter the converted IF signal from the IC 20b and may be positioned outside of the IC 20b. For example, the filter 30b may be a bandpass filter having a predetermined pass band (e.g., 800 MHz, 2.4 GHz) or a highpass filter or lowpass filter having a predetermined cutoff frequency (e.g., 12 GHz, 15 GHz).

According to the filtering at the filter 30b, noise included in the IF signal may be reduced. Since noise contained in the RF signal is dependent on the noise contained in the IF signal, the noise contained in the RF signal may decrease together with the reduction in the noise contained in the IF signal.

Accordingly, the antenna module module2 may easily meet the requirement specification of noise characteristics even without using an additional filter for filtering the RF signal. Accordingly, the antenna module module2 may reduce a size as much as a space to be occupied by the additional filter for filtering the RF signal.

Further, when the antenna 10b includes a plurality of antenna members for antenna performance (e.g., transmission/reception ratio, gain, linearity, etc.), the amount of additional filters for filtering RF signals may need to be increased, and here, the use of the filter 30b in the antenna module module2 may eliminate additional filters respectively corresponding to the plurality of antenna members. Accordingly, the antenna module module2 may be reduced in size by reducing the size of the space to be occupied by the plurality of filters, while ensuring antenna performance.

Figure 3:
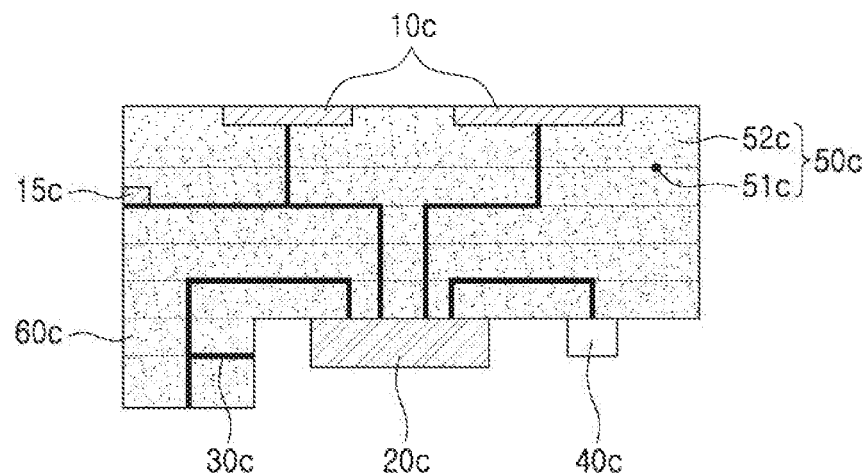
FIG. 3 is a side view of an antenna module according to an exemplary embodiment in the present disclosure.

FIG. 3 is a side view illustrating an antenna module according to an exemplary embodiment in the present disclosure.

Referring to FIG. 3, the antenna module according to an exemplary embodiment in the present disclosure may include antennas 10c, a second directional antenna 15c, an IC 20c, a filter 30c, a passive component 40c, a substrate 50c, and a sub-substrate 60c.

The substrate 50c may include at least one wiring layer 51c and at least one insulating layer 52c and may include at least one via penetrating through the insulating layer to electrically connect a plurality of wiring layers. For example, the substrate 50c may be implemented as a printed circuit board (PCB) and may have a structure in which an upper antenna package and a lower connection member are coupled. For example, the antenna package may be designed in terms of transmission and reception efficiency of an RF signal, and the connection member may be designed in terms of wiring efficiency.

The antennas 10c may be disposed on top of the substrate 50c to transmit and receive RF signals in an upper surface direction and may be realized with a plurality of antenna members. For example, the antennas 10c may be disposed adjacent to an upper surface of the substrate 50c, with a structure of a patch antenna.

The second directional antenna 15c may be disposed adjacent to a side surface of the substrate 50c to transmit and receive RF signals in a lateral direction. For example, the second directional antenna 15c may have a structure of a dipole antenna or a microstrip antenna.

The antenna module according to an exemplary embodiment in the present disclosure may include both the antennas 10c and the second directional antenna 15c to form an omnidirectional radiation pattern.

The IC 20c and the passive component 40c may be disposed to abut a lower surface of the substrate 50c. The passive component 40c may include a capacitor (e.g., multilayer ceramic capacitor (MLCC)), an inductor, or a chip resistor to provide necessary impedance to the IC 20c.

The sub-substrate 60c may be disposed on a lower surface of a substrate 50c and provide a path for an IF signal or a baseband signal. The sub-substrate 60c may be realized as a support member mounted on the outside of the antenna module and to support the antenna module.

The filter 30c may be disposed on the sub-substrate 60c. Accordingly, the filter 30c may be adjacent to the path of the IF signal or the baseband signal to filter an IF signal or a baseband signal, improving filtering performance, and the substrate 50c may secure an extra space corresponding to the filter 30c, reducing a size or further enhancing wiring efficiency.

Figure 4:
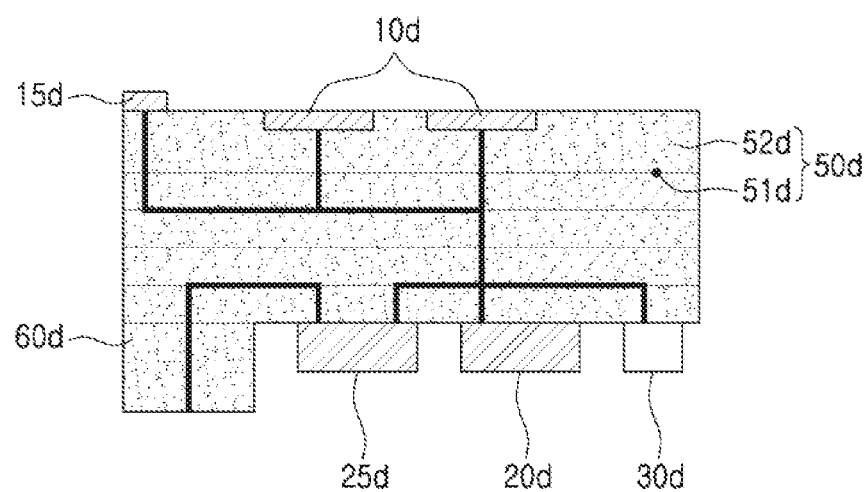
FIG. 4 is a side view illustrating a structure in which an antenna module according to an exemplary embodiment in the present disclosure may further include an IF IC.

FIG. 4 is a side view illustrating a structure in which an antenna module according to an exemplary embodiment in the present disclosure may further include an IF IC.

Referring to FIG. 4, the antenna module according to an exemplary embodiment in the present disclosure may include antennas 10d, a second directional antenna 15d, an IC 20d, an IF IC 25d, a filter 30d, a substrate 50d and a sub-substrate 60d.

The substrate 50d may include at least one wiring layer 51d and at least one insulating layer 52d and may include at least one via penetrating through the insulating layer to electrically connect a plurality of wiring layers.

The second directional antenna 15d may be disposed on an upper surface and abut a side surface of the substrate 50c to transmit and receive RF signals in a lateral direction and/or an upper surface direction and may have a three-dimensional structure such as a chip antenna.

The IC 20d, the IF IC 25d, and the filter 30d may be disposed on a lower surface of the substrate 50d. For example, the filter 30d may be disposed adjacent to the IF IC 25d, adjacent to IC 20d, or between the IC 20d and the IF IC 25d. Accordingly, the filter 30d may filter the IF signal in proximity to a path of the IF signal, improving filtering performance.

Figure 5:
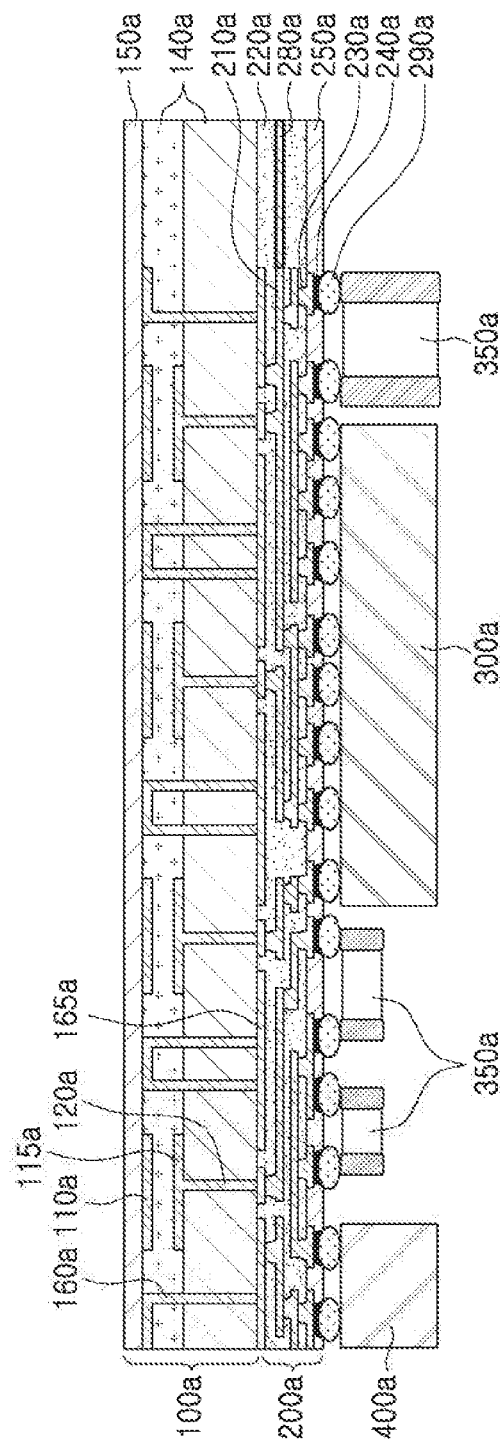
FIG. 5 is a view illustrating a structure in which a filter is disposed on a connection member in an antenna module according to an exemplary embodiment in the present disclosure.

FIG. 5 is a view illustrating a structure in which a filter is positioned at a connection member in an antenna module according to an exemplary embodiment in the present disclosure.

Referring to FIG. 5, the antenna module according to an exemplary embodiment in the present disclosure may include a substrate having a structure in which an antenna package 100a and a connection member 200a are coupled.

The antenna package 100a may include a plurality of antenna members 115a configured to transmit or receive an RF signal, a plurality of feed vias 120a electrically connected to the plurality of antenna members 115a at one end thereof and electrically connected to wirings corresponding to at least one wiring layer 210a of the connection member 200a at the other end, respectively, and a dielectric layer 140a thicker than at least one insulating layer 220a of the connection member 200a, and may be positioned on top of the connection member 200a. Accordingly, the antenna module according to an exemplary embodiment in the present disclosure may form a radiation pattern in an upper surface direction to transmit and receive an RF signal.

Due to the length of the feed via 120a and the thickness of the dielectric layer 140a, boundary conditions for RF signal transmission and reception operations of the plurality of antenna members 115a may be freely designed, and unnecessary boundary conditions (e.g., interlayer spacing, interlayer inserts, etc.) may be removed. Accordingly, since the feed via 120a and the dielectric layer 140a provide boundary conditions (e.g., small manufacturing tolerance, short electrical length, smooth surface, a large extra space, adjustment of a dielectric constant, etc.) advantageous for the transmission and reception operation of RF signals of the plurality of antenna members 115a, antenna performance of the plurality of antenna members 115a may be improved.

The dielectric layer 140a may be formed of a thermosetting resin such as an epoxy resin, a thermoplastic resin such as polyimide, or a resin impregnated in a core material such as glass fiber (glass cloth or glass fabric) together with an inorganic filler, for example, a prepreg, Ajinomoto build-up film (ABF), FR-4, bismaleimide triazine (BT), or the like, and may be formed of a photosensitive insulating resin (photo imageable dielectric (PID)) according to design. For example, the dielectric layer 140a may be formed of a general copper-clad laminate (CCL) or a glass or ceramic-based insulating material according to required material properties. According to designs, the dielectric layer 140a may be formed of a material having a dielectric constant Dk higher than at least one insulating layer 220a of the connection member 200a.

According to designs, the antenna package 100a may further include a plurality of director members 110a arranged on the plurality of antenna members 115a and transmitting or receiving a first RF signal together with the plurality of antenna members 115a. The amount of layers in which the plurality of director members 110a are formed may be determined according to design conditions of a gain and height of the antenna module. Therefore, the amount of the layers is not limited to one.

According to designs, the antenna package 100a may include a plating member 160a disposed to surround a side surface of each of the feed vias 120a to form a plurality of cavities. The plurality of cavities may provide boundary conditions (e.g., small manufacturing tolerance, short electrical length, smooth surface, large extra space, dielectric constant control, etc.) advantageous for formation of a radiation pattern of the plurality of antenna members 115a and improve isolation between the plurality of antenna members 115a.

According to designs, the antenna package 100a may further include a cavity ground layer 165a disposed adjacent to the connection member 200a. The cavity ground layer 165a may improve isolation between the antenna package 100a and the connection member 200a.

According to designs, the antenna package 100a may further include an encapsulation member 150a disposed on the plurality of antenna members 115a. In a state in which the encapsulation member 150a in a liquid state permeates downwards, it may be changed from the liquid state to a solid state. Accordingly, structural stability of the antenna package 100a may be improved. In addition, the encapsulation member 150a may be formed together with a plurality of director members 110a in the process of formation. The encapsulation member 150a may be formed of a photo imageable encapsulant (PIE), an Ajinomoto build-up film (ABF), an epoxy molding compound (EMC), and the like, but is not limited thereto.

The director member 110a, the antenna member 115a, the feed via 120a, the plating member 160a, and the cavity ground layer 165a may be formed of a conductive material such as copper (Cu), aluminum (Al), silver (Ag), tin (Sn), gold (Au), nickel (Ni), lead (Pb), titanium (Ti), or alloys thereof and may be formed through a plating method such as chemical vapor deposition (CVD), physical vapor deposition (PVD), sputtering, subtractive, additive, a semi-additive process (SAP), a modified SAP (MSAP), or the like, but is not limited thereto.

Referring to FIG. 5, the connection member 200a may include at least one wiring layer 210a, at least one insulating layer 220a, wiring vias 230a, a connection pad 240a, a passivation layer 250a, and an electrical connection structure 290a, and may have a structure similar to that of a copper redistribution layer (RDL).

For example, some and the other of each of the at least one wiring layer 210a, the at least one insulating layer 220a, and the wiring vias 230a included in the connection member 200a may be independently manufactured and subsequently connected to each other through the connection pads 240a, the passivation layer 250a, and the electrical connection structures 290a. According to designs, at least one wiring layer 210a, at least one insulating layer 220a, and the wiring vias 230a may be integrally manufactured, and thus, the connection pad 240a, the passivation layer 250a, and the electrical connection structures 290a may be omitted.

Referring to FIG. 5, the antenna module according to an exemplary embodiment in the present disclosure may further include an IC 300a, a passive component 350a, and a sub-member 400a.

The IC 300a may have an active surface (e.g., an upper surface) electrically connected to at least one wiring layer 210a and an inactive surface (e.g., a lower surface) disposed on the opposite side of the active surface. The IC 300a may transfer an RF signal to the antenna package 100a and receive an RF signal from the antenna package 100a.

The sub-member 400a may receive an IF signal or a baseband signal from the outside of the antenna module or may transfer an IF signal or a baseband signal to the outside. For example, the sub-member 400a may be implemented as a support member or may be realized as a coaxial cable connector or receptacle according to designs.

Referring to FIG. 5, the antenna module according to an exemplary embodiment in the present disclosure may include a filter 280a disposed in the connection member 200a. For example, the filter 280a may be disposed on the same layer as that of at least one wiring layer 210a and may be electrically connected to a wiring corresponding to the at least one wiring layer 210a.

Figure 6:
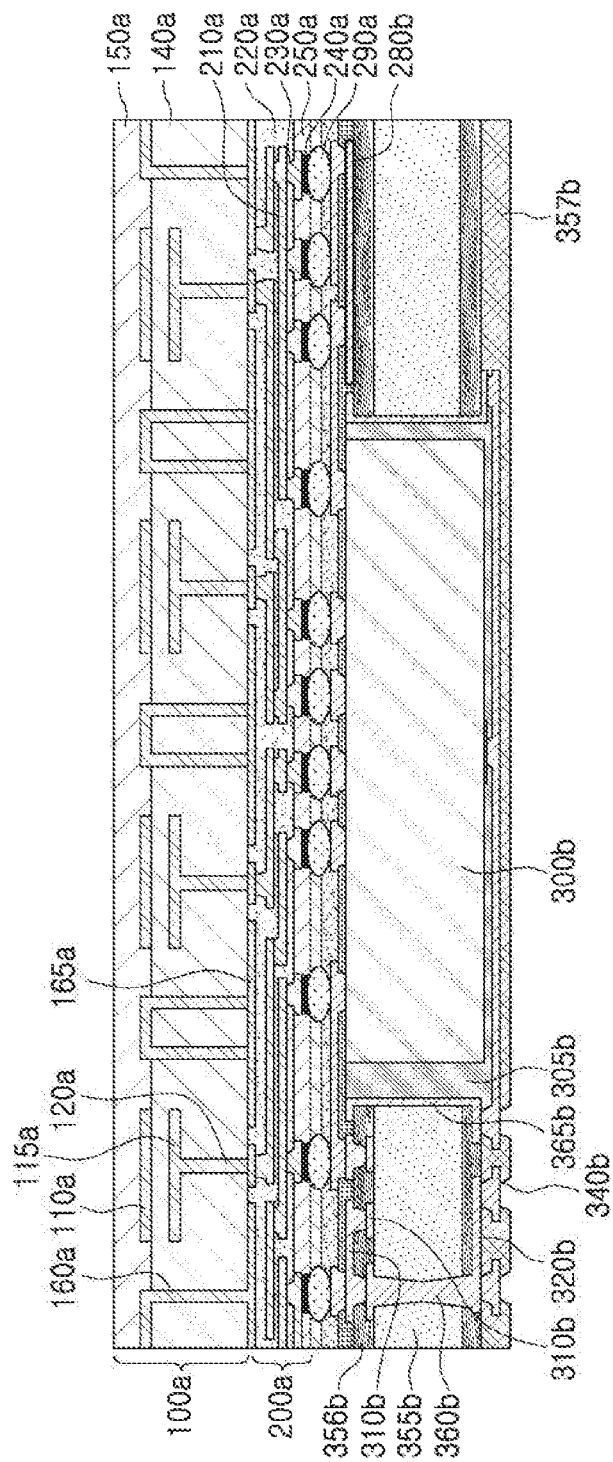
FIG. 6 is a view illustrating a structure in which a filter is disposed on an upper surface of a support member in an antenna module according to an exemplary embodiment in the present disclosure.

FIG. 6 is a view illustrating a structure in which a filter is disposed on an upper surface of a support member in an antenna module according to an exemplary embodiment in the present disclosure.

Referring to FIG. 6, an antenna module according to an exemplary embodiment in the present disclosure may include the antenna package 100a, the connection member 200a, an IC 300b, a encapsulant 305b, an upper wiring layer 310b, a lower wiring layer 320b, an electrical connection structure 340b, a support member 355b, a core insulating layer 356b, a core via 360b, and a core plating member 365b.

The IC 300b may have an active surface (e.g., an upper surface) electrically connected to at least one wiring layer 210a and an inactive surface (e.g., a lower surface) disposed on the opposite side of the active surface. The IC 300b may transfer an RF signal to the antenna package 100a and receive an RF signal from the antenna package 100a.

The encapsulant 305b may seal at least a portion of the IC 300b. The encapsulant 305b may protect the IC 300b from an external electrical/physical/chemical impact and may be formed of a PIE, ABF, EMC, or the like, but is not limited thereto.

The upper wiring layer 310b may be disposed on top of the support member 355b or adjacent to the connection member 200a and electrically connect the active surface of the IC 300b and the core via 360b. Accordingly, the IC 300b may secure a transmission path of an IF signal or a baseband signal.

The lower wiring layer 320b may be disposed on bottom of the support member 355b and may be electrically connected to the core via 360b.

The electrical connection structure 340b may electrically connect the core via 360b to the outside of the antenna module, on bottom of the support member 355b. For example, the electrical connection structure 340b may have a structure such as that of a solder ball, a pin, and a land.

The support member 355b may include at least one core wiring layer, at least one core insulating layer 356b, and the core via 360b. The core via 360b may be a path for an IF signal or a baseband signal to pass therethrough.

That is, the IF signal or the baseband signal may sequentially pass through the electrical connection structure 340b, the core via 360b, the upper wiring layer 310b, and the IC 300b.

The core plating member 365b may be disposed on a side surface of the support member 355b in a direction toward the IC 300b. The core plating member 365b may improve isolation between the IC 300b and the support member 355b, reducing noise of the IF signal or the baseband signal. In addition, the core plating member 365b may efficiently dissipate heat generated in the IC 300b to the outside of the antenna module.

Referring to FIG. 6, the antenna module according to an exemplary embodiment in the present disclosure may include a filter 280b disposed on top of the support member 355b. The filter 280b may be electrically connected to the core via 360b or the IC 300b through the upper wiring layer 310b.

In some embodiments, a passivation layer 357b may be disposed on the lower wiring layer 320b to physically and chemically protect the lower wiring layer 320b. The passivation layer 357b may include openings for the connection structures 340b. The passivation layer 357b may be formed of a suitable insulating material such as, for example, polyimide, etc.

Figure 7:
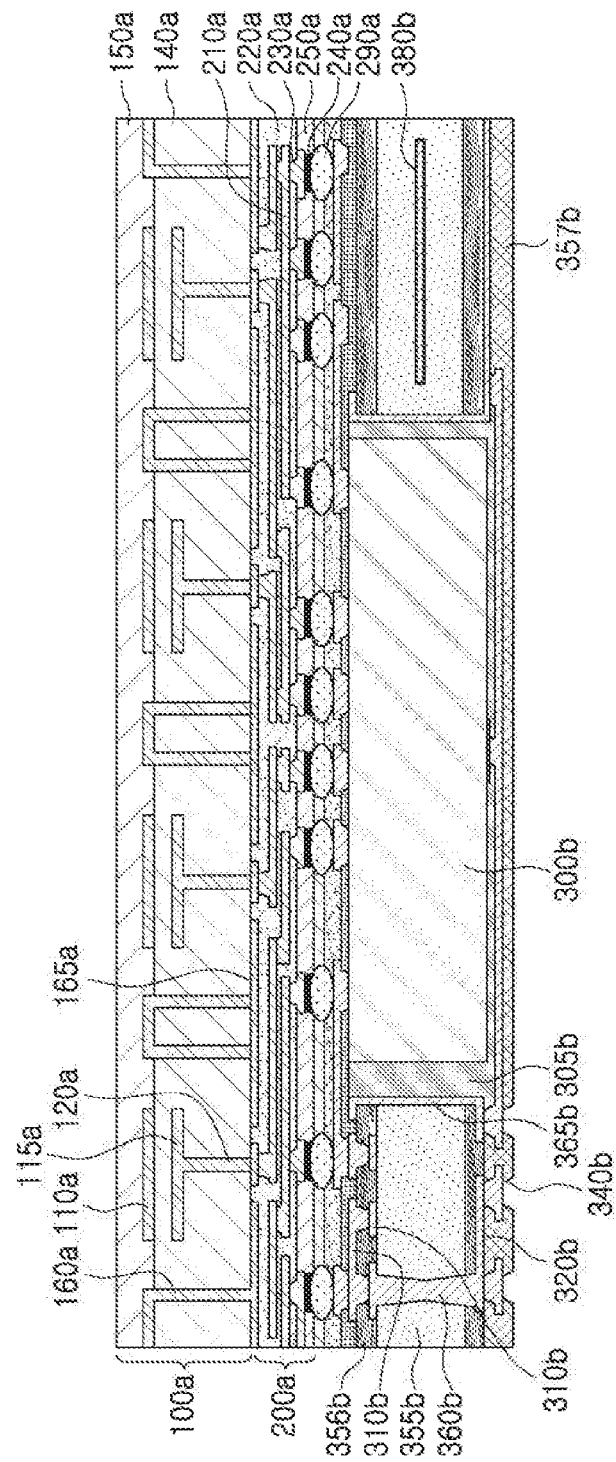
FIG. 7 is a view illustrating a structure in which a filter is disposed in an inner layer of a support member in an antenna module according to an exemplary embodiment in the present disclosure.

FIG. 7 is a view illustrating a structure in which a filter is disposed in an inner layer of a support member in an antenna module according to an exemplary embodiment in the present disclosure.

Referring to FIG. 7, the antenna module according to an exemplary embodiment in the present disclosure may include a filter 380b disposed inside the support member 355b. That is, the filter 380b may be disposed in the core wiring layer of the support member 355b. For example, the filter 380b may have a three-dimensional structure using a plurality of core wiring layers, and thus may have a waveguide structure or a wafer-based structure. That is, the antenna module according to an exemplary embodiment in the present disclosure may include filters having various structures.

Meanwhile, the antenna module according to an exemplary embodiment in the present disclosure may include a upper ground pattern (not shown) disposed in the upper wiring layer 310b and overlapping the filter 380b at the upper end thereof, and a lower ground pattern disposed in the lower wiring layer 320b and overlapping the filter 380b at the lower end. Accordingly, noise provided to the filter 380b from outside the antenna module or in the antenna package 100a may be reduced.

Figure 8:
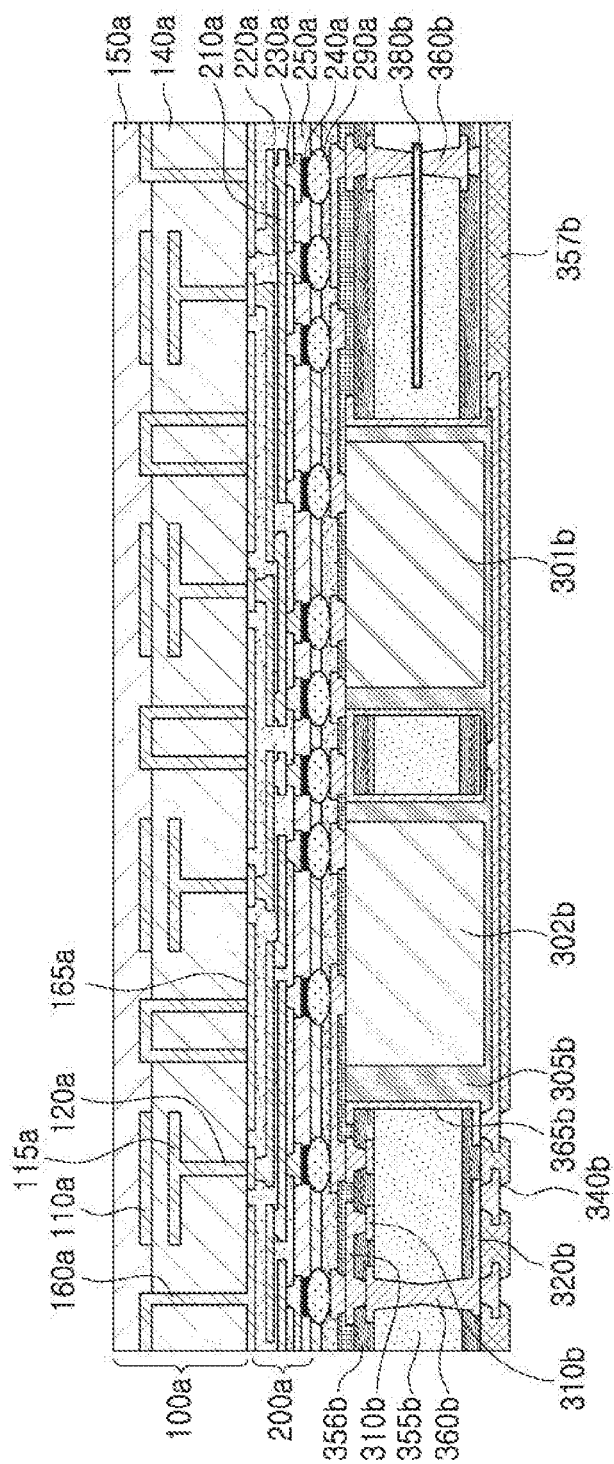
FIG. 8 is a view illustrating a structure in which an IC and an IF IC are disposed together in an antenna module according to an exemplary embodiment in the present disclosure.

FIG. 8 is a view illustrating a structure in which an IC and an IF IC are disposed together in an antenna module according to an exemplary embodiment in the present disclosure.

Referring to FIG. 8, the antenna module according to an exemplary embodiment in the present disclosure may include an IC 301b and an IF IC 302b, disposed on a lower surface of the connection member 200a.

The IC 301b and the IF IC 302b may be electrically connected through the upper wiring layer 310b or at least one wiring layer 210a of the connection member 200a. The support member 355b may be disposed to surround each of the IC 301b and the IF IC 302b. A portion of the support member 355b may be disposed between the IC 301b and the IF IC 302b. Since the core plating member 365b is disposed on the side surface of the support member 355b, the IC 301b and the IF IC 302b may reduce a negative influence (e.g., electromagnetic noise, heat) exerted on each other.

Here, the filter 380b may be disposed in the support member 355b and may be electrically coupled to the IF IC 302b to filter an IF signal.

Meanwhile, the filter 380b may be electrically connected to the core wiring layer of the support member 355b, the upper wiring layer 310b, or the lower wiring layer 320b through the core via 360b of the support member 355b.

Figure 9:
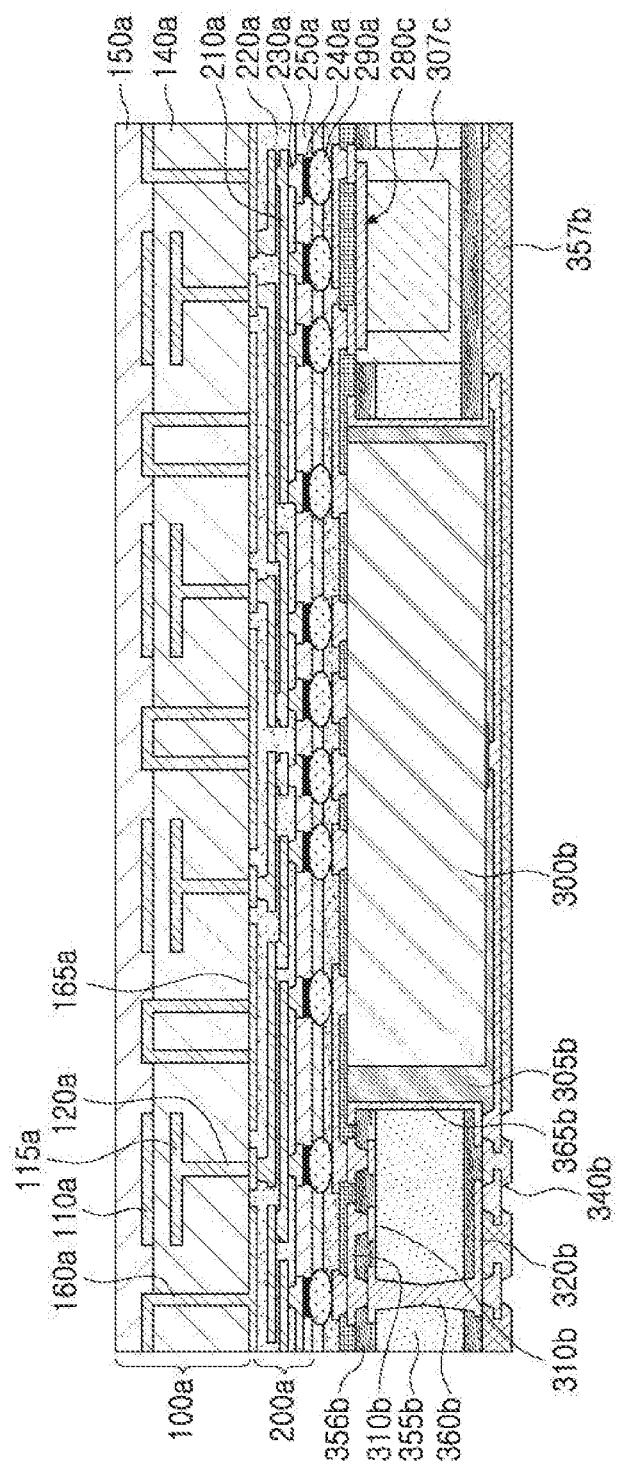
FIG. 9 is a view illustrating a filter and an accommodation space in an antenna module according to an exemplary embodiment in the present disclosure.

FIG. 9 is a view illustrating a filter and an accommodation space in an antenna module according to an exemplary embodiment in the present disclosure.

Referring to FIG. 9, an antenna module according to an exemplary embodiment in the present disclosure may include a filter 280c disposed on a lower surface of a connection member 200a and disposed in an accommodation space 307c of a support member 355b.

That is, the support member 355b may provide a space for arranging the filter 280c using the accommodation space 307c when a volume of the filter 280c is large. Accordingly, the antenna module according to the exemplary embodiment in the present disclosure may use various types/sizes of filter 280c.

Figure 10:
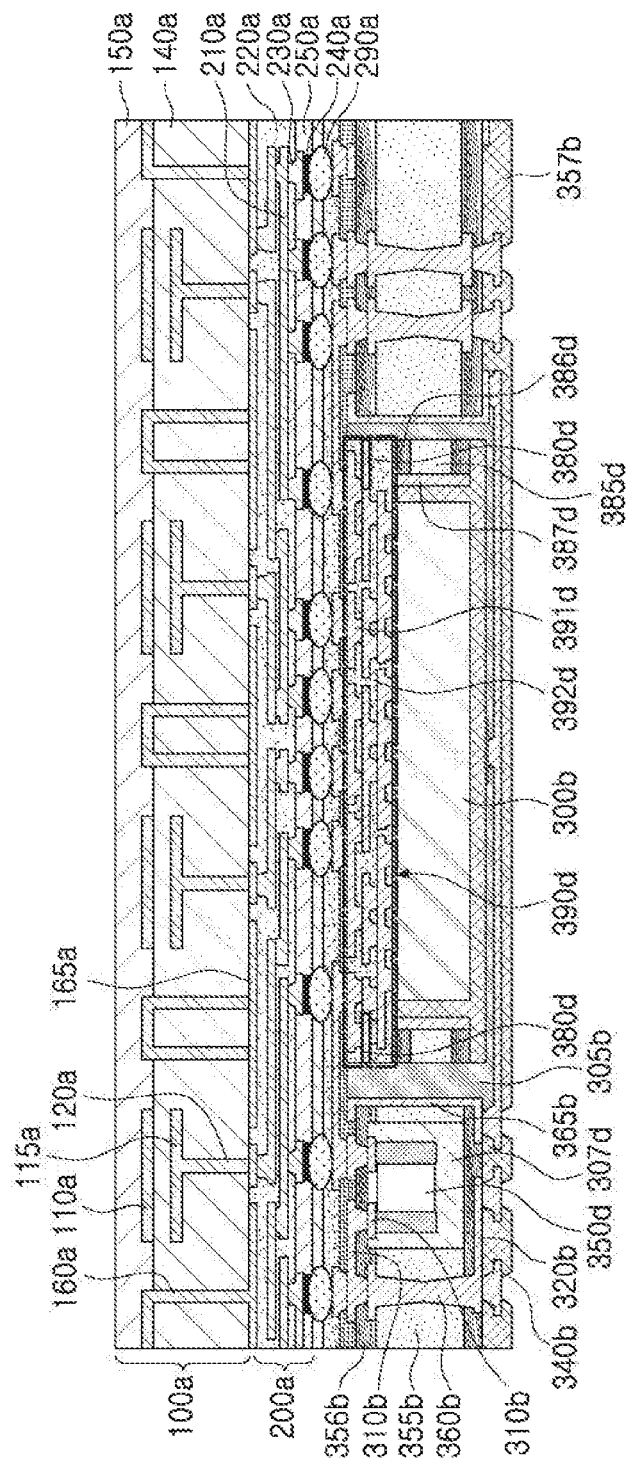
FIG. 10 is a view illustrating a filter disposed in a second connection member in an antenna module according to an exemplary embodiment in the present disclosure.
Figure 11A:
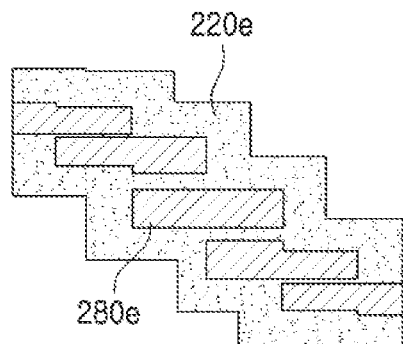
FIGS. 11A to 11D are a view illustrating various types of filters disposed in an antenna module according to an exemplary embodiment in the present disclosure.
Figure 11B:
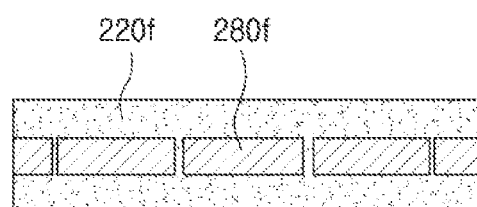
Figure 11C:
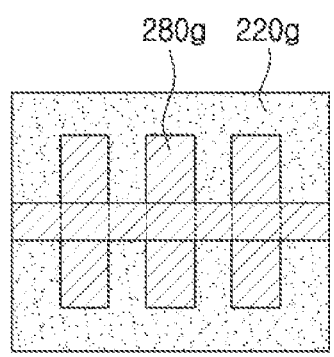
Figure 11D:
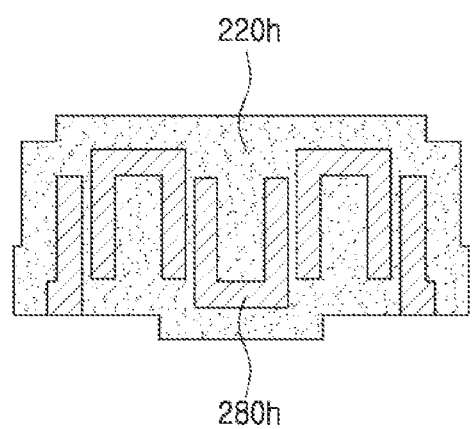

FIG. 10 is a view illustrating a filter disposed at a second connection member in an antenna module according to an exemplary embodiment in the present disclosure.

Referring to FIG. 10, the antenna module according to an exemplary embodiment in the present disclosure may include a second connection member 390d disposed on a lower surface of the connection member 200a and the IC 300b disposed on a lower surface of the second connection member 390d.

The second connection member 390d may include at least one second wiring layer 391d and at least one second insulating layer 392d and may have an upper surface and a lower surface smaller than areas of an upper surface and a lower surface of the connection member 200a.

The connection member 200a may be formed sequentially in units of layers from a lower surface of the antenna package 100a and the second connection member 390d may be formed sequentially in units of layers from an upper surface of the IC 300b. Thereafter, the lower surface of the connection member 200a and the upper surface of the second connection member 390d may join each other. Accordingly, the antenna module according to the exemplary embodiment in the present disclosure may secure a large number of wiring layers and insulating layers to thus provide more grounds to the IC 300b to more efficiently assist an operation of the IC 300b or improve wiring efficiency between the IC 300b and the antenna package 100a.

In addition, the antenna module according to an exemplary embodiment in the present disclosure may include a filter 380d disposed in at least one second wiring layer 391d of the second connection member 390d. Securing a larger number of wiring layers and insulating layers due to the connection member 200a and the second connection member 390d, the antenna module may stably provide a space for arranging the filter 380d.

The antenna module according to an exemplary embodiment in the present disclosure may include a second support member 385d, a second core insulating layer 386d, and the second core plating member 387d disposed on a lower surface of the second connection member 390d. Accordingly, isolation between the IC 300b and the core via 360b or the filter 380d may be improved.

FIGS. 11A to 11D are a view illustrating various forms of a filter disposed in an antenna module according to an exemplary embodiment in the present disclosure.

Referring to FIGS. 11A to 11D, filters 280e, 280f, 280g, and 280h disposed in the antenna module according to an exemplary embodiment in the present disclosure may be realized as various types of conductor patterns having impedances corresponding to frequencies of IF signals and may be disposed in insulating layers 220e, 220f, 220g, and 220h of the connection member and the support member, respectively.

Meanwhile, an antenna module according to an exemplary embodiment in the present disclosure may include a first filter disposed outside of the IC and having a pass band of a reference frequency to filter an IF signal or a baseband signal, a second filter disposed outside of the IC and having a pass band of a frequency lower than the reference frequency to filter an IF signal or a baseband signal, and a third filter disposed outside of the IC and having a pass band of frequency higher than the reference frequency to filter an IF signal or a baseband signal. That is, since the antenna module according to an exemplary embodiment in the present disclosure may separately filter various IF signals, it may be optimized for various communications standards so as to operate.

Figure 12:
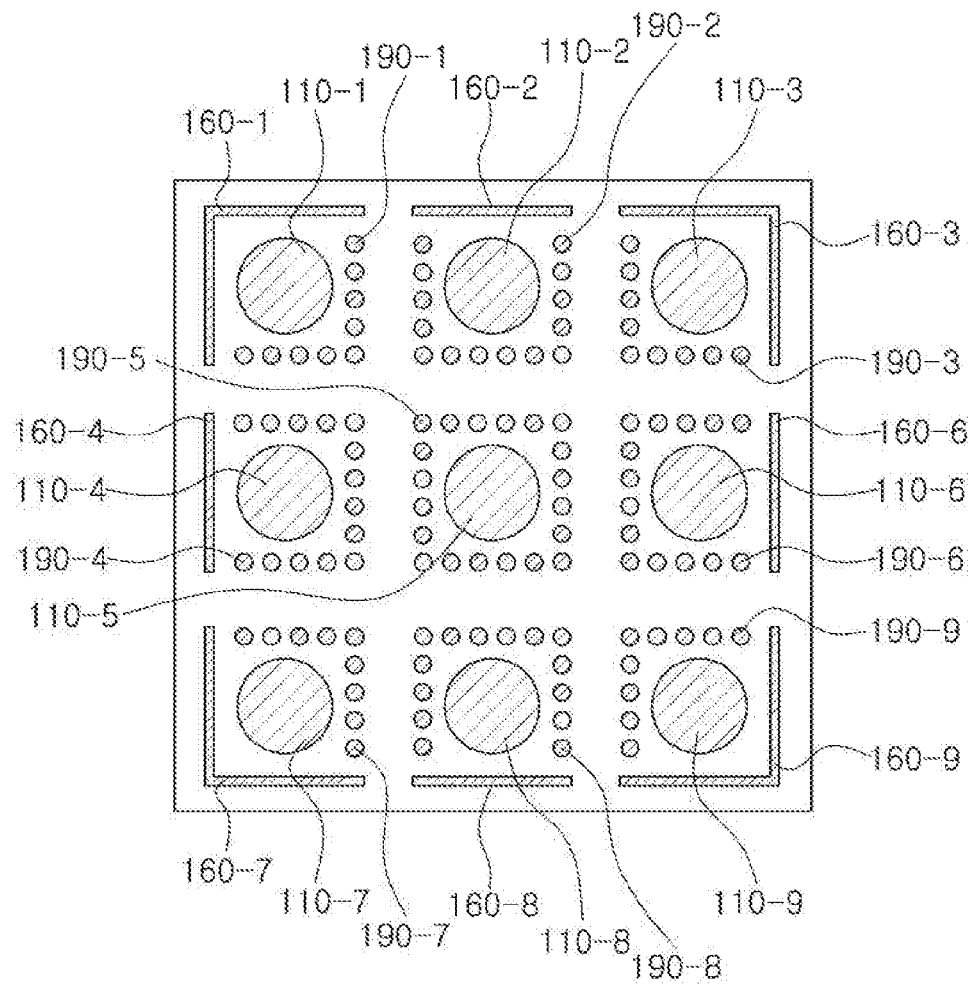
FIG. 12 is a top view of an antenna module according to an exemplary embodiment in the present disclosure.

FIG. 12 is a top view of an antenna module according to an exemplary embodiment in the present disclosure.

Referring to FIG. 12, each of a plurality of director members 110-1, 110-2, 110-3, 110-4, 110-5, 110-6, 110-7, 110-8, and 110-9 may be surrounded by at least one of plating members 160-1, 160-2, 160-3, 160-4, 160-6, 160-7, 160-8, and 160-9 and a plurality of shielding vias 190-1, 190-2, 190-3, 190-4, 190-5, 190-6, 190-7, 190-8, and 190-9 corresponding thereto. If the antenna module does not include the plurality of director members, the plurality of director members 110-1, 110-2, 110-3, 110-4, 110-5, 110-6, 110-7, 110-8, and 110-9 may be replaced with a plurality of antenna members.

Meanwhile, the amount, arrangement, and shape of the plurality of director members or the plurality of antenna members illustrated in FIG. 12 are not limited. For example, the amount of the plurality of antenna members illustrated in FIG. 12 may be four or sixteen.

Meanwhile, the plurality of shielding vias illustrated in FIG. 12 may be replaced with a plating member, and the plating members illustrated in FIG. 12 may be replaced with a plurality of shielding vias.

Figure 13A:
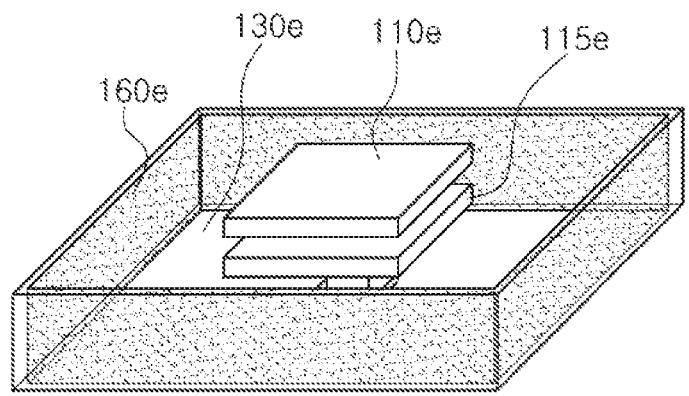
FIG. 13A to 13C are perspective views each illustrating an example of a cavity of an antenna package of an antenna module according to an exemplary embodiment in the present disclosure.
Figure 13B:
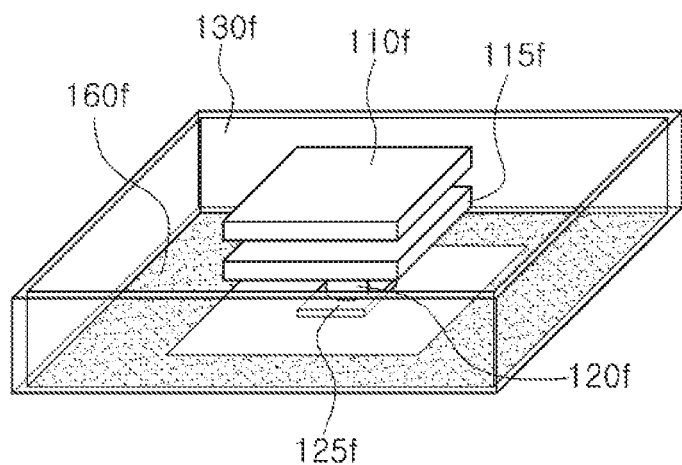
Figure 13C:
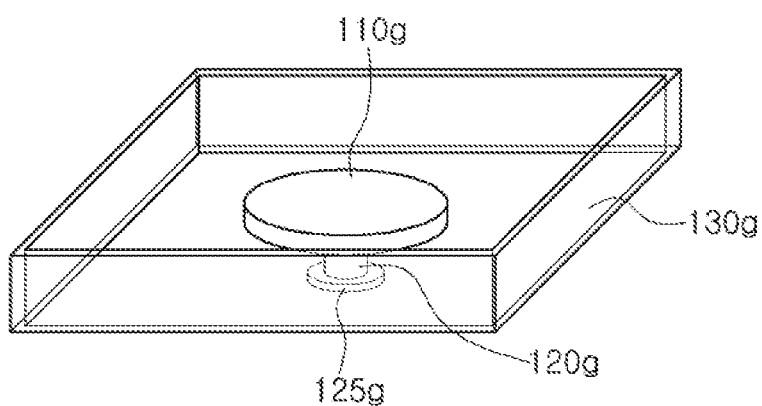

FIGS. 13A through 13C are perspective views each illustrating an example of a cavity of an antenna package of the present disclosure.

Referring to FIG. 13A, a cavity may include at least some of a director member 110e, an antenna member 115e, a feed via, an electrical connection structure, a dielectric layer 130e, and a plating member 160e. Here, the plating member 160e may be arranged to surround a side surface of the cavity. That is, a lower surface of the cavity may be covered by a ground pattern disposed on an upper surface of the connection member.

Referring to FIG. 13B, a cavity may include at least some of a director member 110f, an antenna member 115f, a feed via 120f, an electrical connection structure 125f, a dielectric layer 130f, and a plating member 160f. Here, the plating member 160f may be arranged to cover a portion of a lower surface of the cavity. That is, a side surface of the cavity may be surrounded by the plating member. Accordingly, isolation of the antenna package with respect to the connection member and the IC may be improved.

Referring to FIG. 13C, a cavity may include at least some of an antenna member 110g, a feed via 120g, an electrical connection structure 125g, and a dielectric layer 130g. That is, a side surface of the cavity may be surrounded by a side surface of the dielectric layer, and a lower surface of the cavity may be covered by a ground pattern disposed on an upper surface of the connection member.

Meanwhile, the electrical connection structures 125f and 125g may be connected to a corresponding wiring of at least one wiring layer of the connection member when the antenna package and the connection member are coupled. For example, the electrical connection structures 125f and 125g may be realized as an electrode, a pin, a solder ball, a land, or the like.

Figure 14:
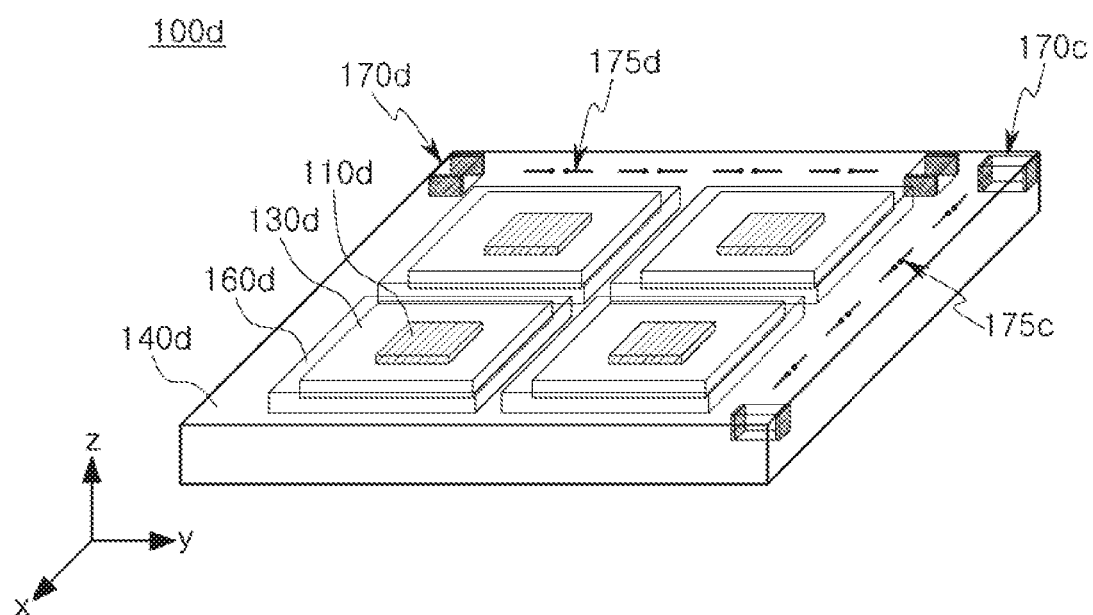
FIG. 14 is a perspective view illustrating an example of an antenna package of an antenna module according to an exemplary embodiment in the present disclosure.

FIG. 14 is a perspective view illustrating an example of an antenna package of the present disclosure.

Referring to FIG. 14, an antenna package may include a plurality of director members 110d, a cavity 130d, a dielectric layer 140d, a plating member 160d, a plurality of second directional antenna members 170c and 170d, and a plurality of dipole antennas 175c and 175d, and thus, an antenna module according to an exemplary embodiment in the present disclosure may form an omnidirectional radiation pattern.

The plurality of director members 110d may transmit and receive RF signals in a z-axis direction together with corresponding antenna members.

The plurality of second directional antenna members 170c and 170d may be disposed to be upright in the z axis direction adjacent to the edge of the antenna package. One of the plurality of second directional antenna members 170c and 170d may be transmit and receive a second RF signal in the x-axis direction and the other may transmit and receive the second RF in the y-axis direction.

The plurality of dipole antennas 175c and 175d may be disposed between the dielectric layer 140d and an encapsulation member adjacent to the edge of the antenna package. One of the dipole antennas 175c and 175d may transmit and receive a third RF signal in the x-axis direction and the other may transmit and receive the third RF signal in the y axis direction. According to designs, at least some of the plurality of dipole antennas 175c and 175d may be replaced with monopole antennas.

Meanwhile, the connection members, support members, core vias, ICs, and IF ICs discussed in the present disclosure may be realized according to a fan-out semiconductor package described hereinafter. The fan-out semiconductor package will be described in detail with reference to FIGS. 15 through 22 to help understanding of the fan-out semiconductor package.

Figure 15:
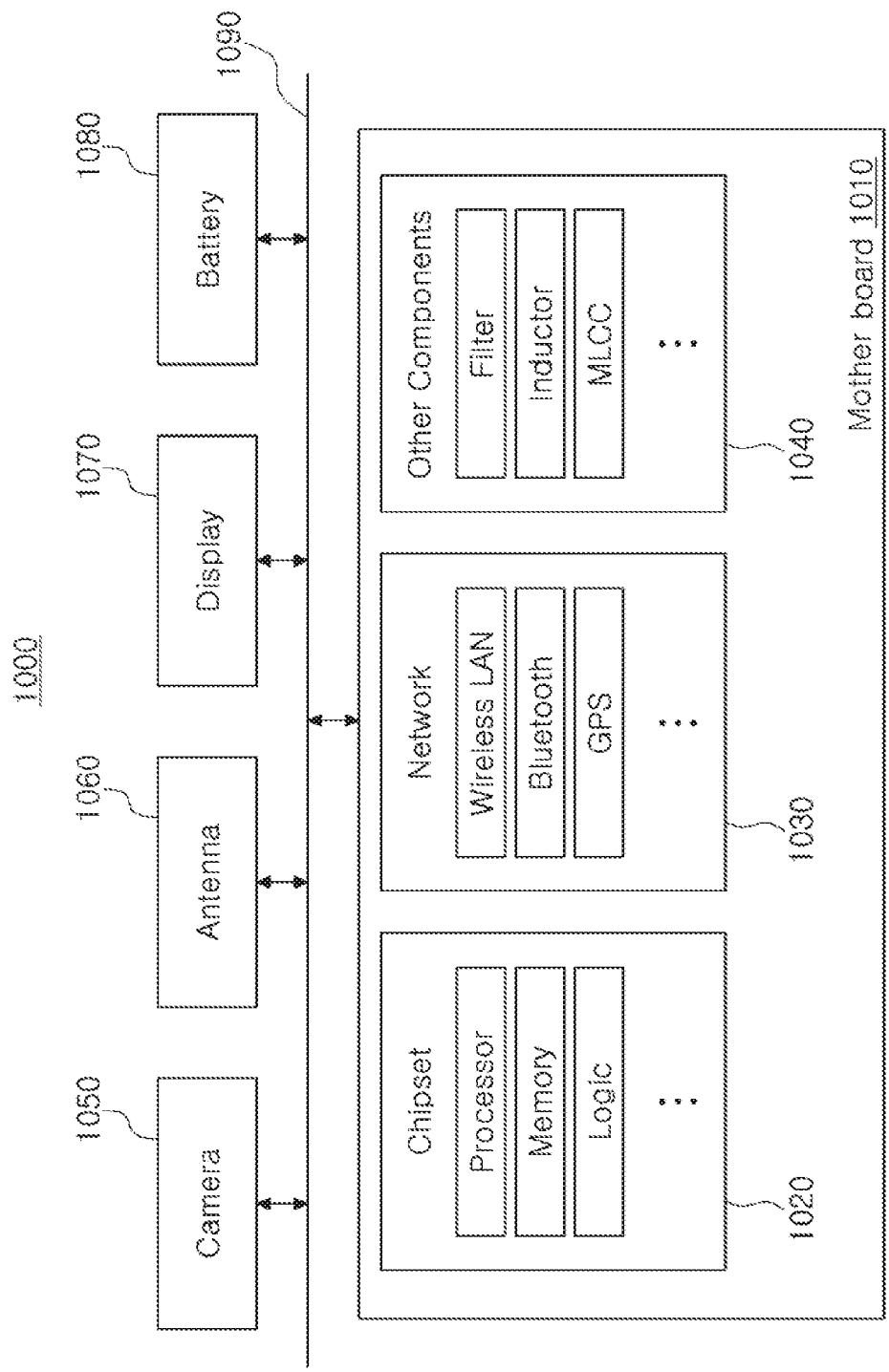
FIG. 15 is a block diagram schematically illustrating an example of an electronic device system.

FIG. 15 is a block diagram schematically illustrating an example of an electronic device system.

Referring to FIG. 15, an electronic device 1000 accommodates a main board (or mother substrate) 1010. The main board 1010 is physically and/or electrically connected to a chip-related component 1020, a network-related component 1030, and other component 1040. The components are also combined with any other electronic component (to be described later) to form various signal lines 1090.

The chip-related component 1020 includes a memory chip such as a volatile memory (e.g., a DRAM), a non-volatile memory (e.g., a ROM), a flash memory, and the like, an application processor chip such as a central processor (e.g., a CPU), a graphics processor (e.g., GPU), a digital signal processor, a cryptographic processor, a microprocessor, a micro-controller, and the like, a logic chip such as an analog-to-digital converter, an application-specific IC (ASIC), and the like, but the chip-related component 1020 is not limited thereto and may include any other types of chip-related electronic component. Also, these electronic components 1020 may be combined with each other.

The network-related component 1030 may include Wi-Fi (IEEE 802.11 family, etc.), WiMAX (IEEE 802.16 family, etc.), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter. However, the network-related component 1030 is not limited thereto and any other among a plurality of wireless or wired standards or protocols. Also, the network-related component 1030 may be combined with the chip-related electronic component 1020.

The other component 1040 includes a high-frequency inductor, a ferrite inductor, a power inductor, a ferrite bead, a Low Temperature Co-Fired Ceramic (LTCC), an Electro Magnetic Interference (EMI) filter, a Multilayer Ceramic Condenser (MLCC), and the like, but is not limited thereto and may include passive components used for various other purposes. It is also to be understood that other components 1040 may be combined with each other in conjunction with the chip-related electronic component 1020 and/or the network-related electronic component 1030.

According to types of electronic device 1000, the electronic device 1000 may include other electronic components that may or may not be physically and/or electrically connected to the main board 1010. The other electronic components include, for example, a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage device (e.g., a hard disk drive) (not shown), a compact disk (CD) (not shown), a digital versatile disk (DVD) (not shown), and the like. However, the other electronic components are not limited thereto and may include other electronic components used for various purposes according to types of the electronic device 1000.

The electronic device 1000 may be a smart phone, a personal digital assistant (PDA), a digital video camera, a digital still camera, a network system, a computer, a monitor, a tablet, a laptop, a netbook, a television, a video game, a smart watch, an automotive, and the like. However, the electronic device 1000 is not limited thereto and may be any other electronic device that processes data.

Figure 16:
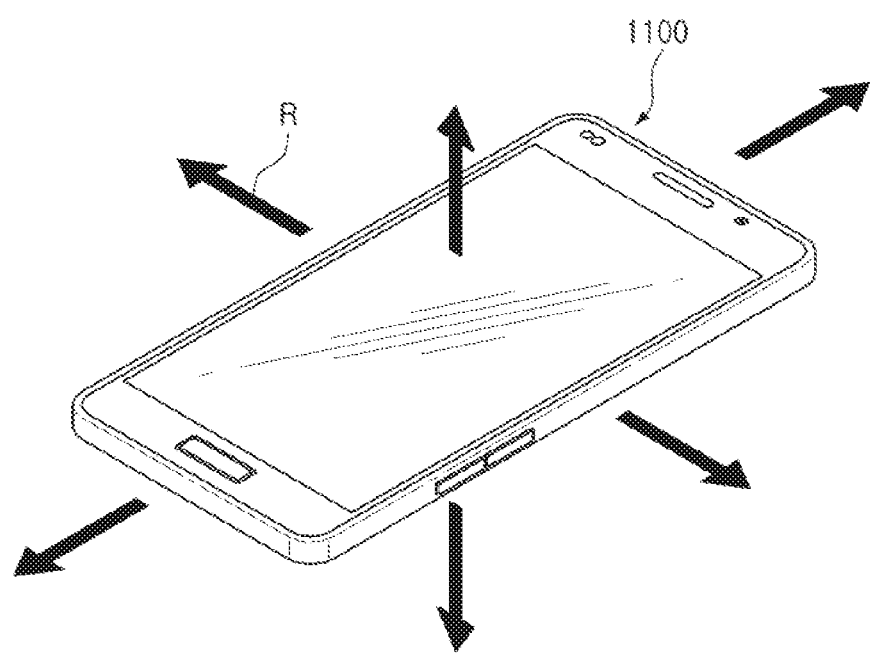
FIG. 16 is a perspective view schematically illustrating an example of an electronic device.

FIG. 16 is a perspective view schematically illustrating an example of an electronic device.

Referring to FIG. 16, the electronic device may be, for example, a smartphone 1100. A radio frequency integrated circuit (RFIC) may be applied in the form of a semiconductor package to the smartphone 1100, and an antenna may be applied in the form of a substrate or a module. As the RFIC and an antenna are electrically connected in the smartphone 1100, an antenna signal may be radiated (R) in various directions. The semiconductor package including the RFIC and the substrate or module including the antenna may be applied in various forms to an electronic device such as a smartphone, or the like.

Generally, a semiconductor chip has many microelectronic circuits integrated therein, but the semiconductor chip itself may not serve as a finished semiconductor product and has a possibility of being damaged by an external physical or chemical impact. Therefore, the semiconductor chip itself is not used as is but is packaged so that the semiconductor chip in a package state is used in an electronic device.

The reason that the semiconductor packaging is required, is because there is a difference in circuit width between the semiconductor chip and the main board of the electronic device from the viewpoint of electrical connection. Specifically, in the case of the semiconductor chip, sizes of the connection pads and a spacing between the connection pads are very small. Meanwhile, in the case of a main board used in an electronic device, a size of an electronic component mounting pad and a spacing between the electronic component mounting pads are much bigger than a scale of the semiconductor chip. Therefore, it may be difficult to directly mount the semiconductor chip on such a main board, and a packaging technique which may buffer the difference in circuit width therebetween is required.

The semiconductor package manufactured by such a packaging technique may be classified as a fan-in semiconductor package and a fan-out semiconductor package according structures and purposes.

Hereinafter, the fan-in semiconductor package and the fan-out semiconductor package will be described in detail with reference to the accompanying drawings.

Figure 17B:
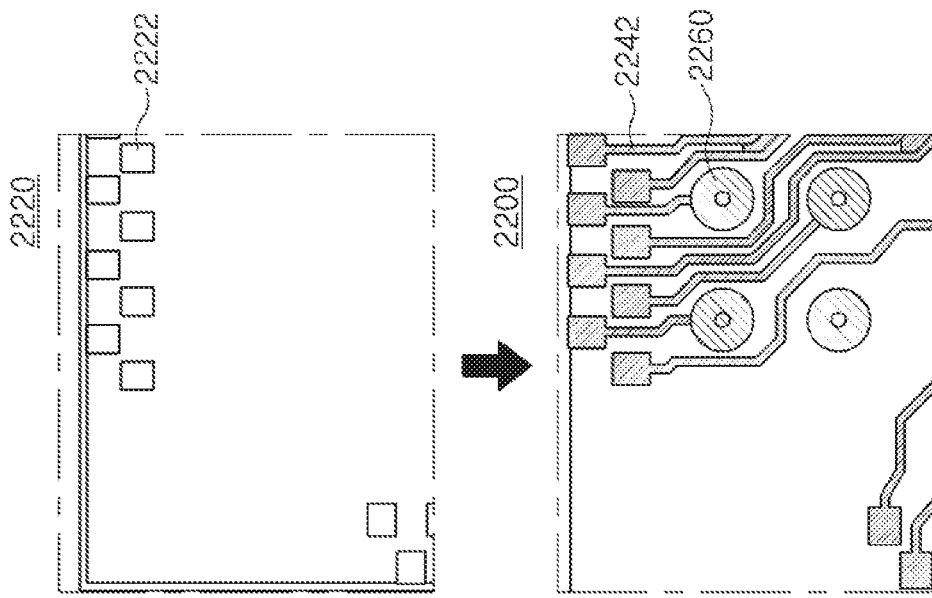
FIGS. 17A and 17B are a cross-sectional view schematically illustrating states before and after packaging a fan-in semiconductor package.
Figure 17A:
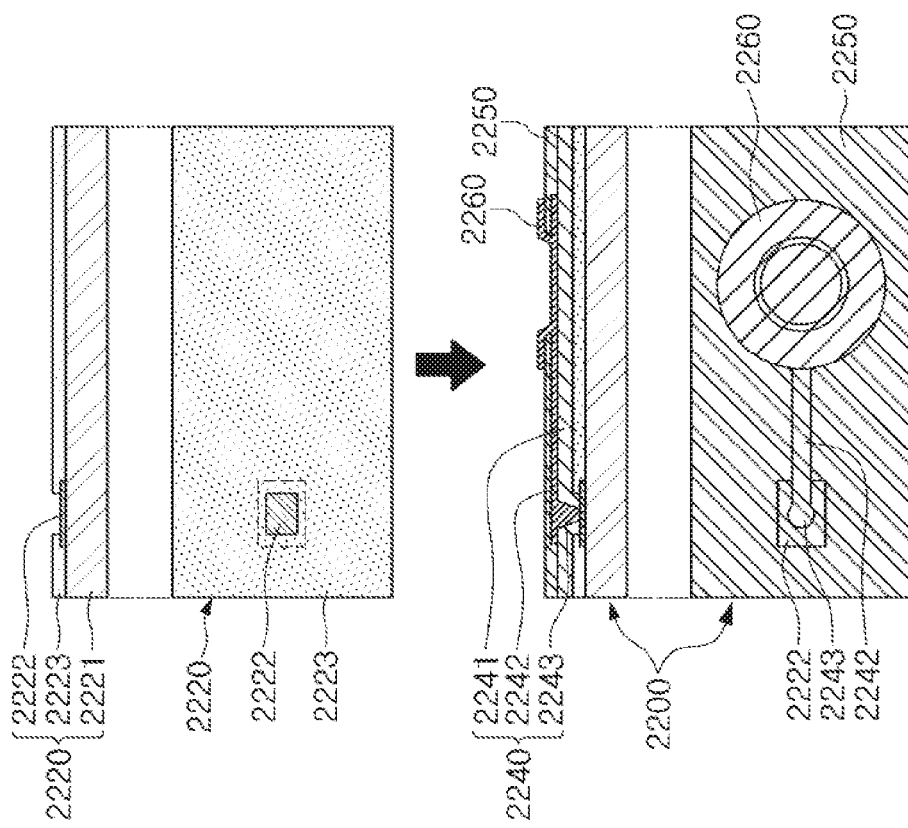

FIGS. 17A and 17B are a cross-sectional view schematically illustrating states before and after packaging a fan-in semiconductor package.

Figure 18:
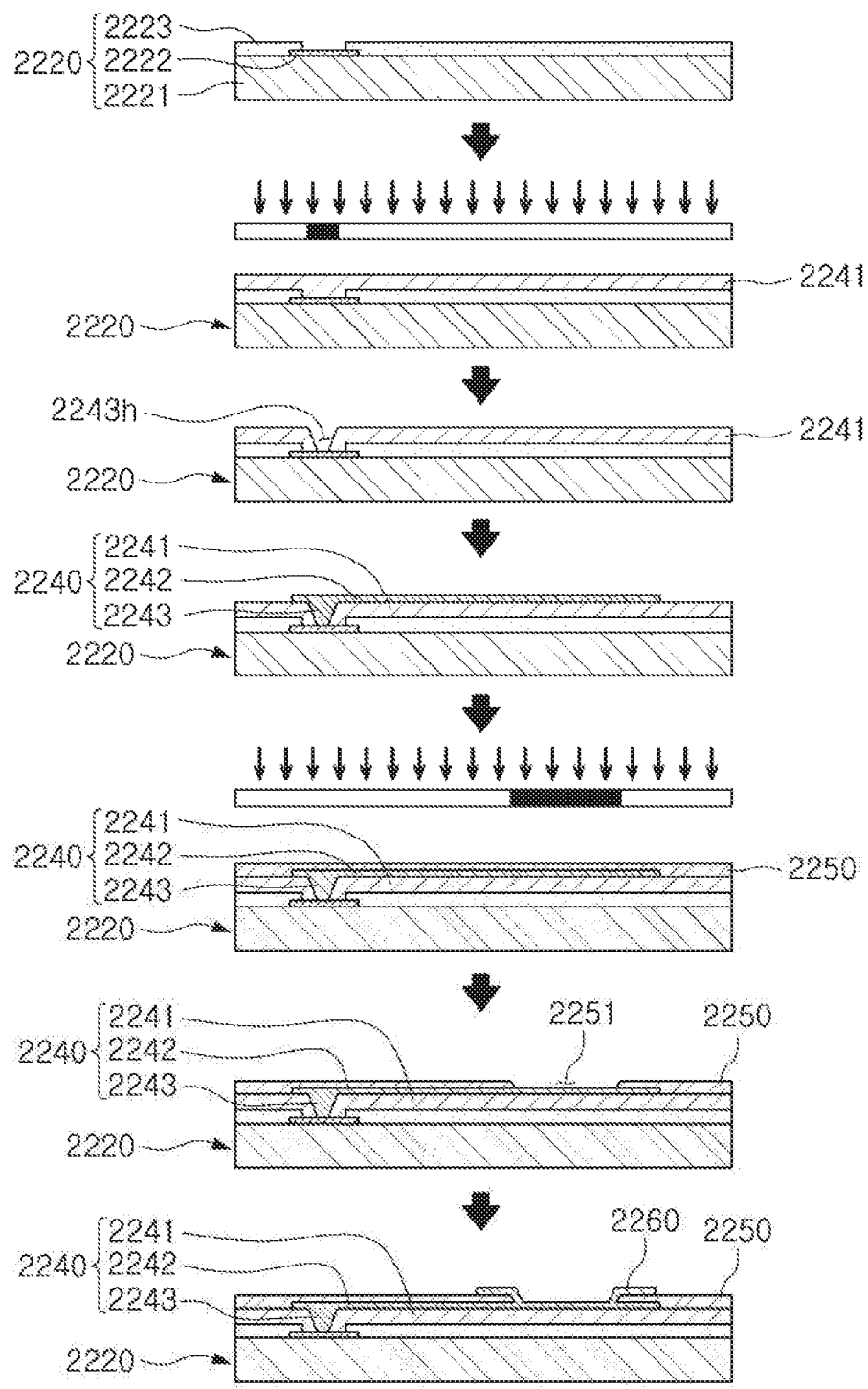
FIG. 18 is a cross-sectional view schematically illustrating a packaging process of a fan-in semiconductor package.

FIG. 18 is a cross-sectional view schematically illustrating a packaging process of a fan-in semiconductor package.

Referring to FIGS. 17A, 17B and 18, a semiconductor chip 2220 may be, for example, a bare integrated circuit (IC) including a body 2221 including silicon (Si), germanium (Ge), a gallium arsenide (GaAs), and the like, a connection pad 2222 formed on one surface of the body 2221 and including a conductive material such as aluminum (Al), or the like, and a passivation film 2223 such as an oxide film or a nitride film formed on one surface of the body 2221 and covering at least a portion of the connection pads 2222. Here, since the connection pad 2222 is very small, it is difficult for the IC to be mounted even on a medium-level PCB, let alone a main board of an electronic device, and the like.

In order to rewire the connection pad 2222, a connection member 2240 is formed on the semiconductor chip 2220 according to a size of the semiconductor chip 2220. The connection member 2240 may be formed by forming an insulating layer 2241 with an insulating material such as a photosensitive insulating resin (PID) on the semiconductor chip 2220, forming a via hole 2243h opening the connection pad 2222, and subsequently forming a wiring pattern 2242 and a via 2243. Thereafter, a passivation layer 2250 for protecting the connection member 2240 is formed, an opening 2251 is formed, and an underbump metallization layer 2260, or the like, is subsequently formed. That is, through a series of processes, a fan-in semiconductor package 2200 including, for example, the semiconductor chip 2220, the connection member 2240, the passivation layer 2250, and the underbump metallization layer 2260 is manufactured.

As described above, the fan-in semiconductor package may be in the form of a package in which the connection pads of the semiconductor chip, for example, input/output (I/O) terminals are all disposed inside the device, may have good electrical properties, and may be produced at low cost. Accordingly, many devices to be disposed in a smartphone are manufactured in the form of the fan-in semiconductor package and development is being made toward realization of a small size and fast signal transmission.

However, in the fan-in semiconductor package, all of the I/O terminals must be disposed inside the semiconductor chip, so that there are many space limitations. Therefore, such a structure is difficult to apply to a semiconductor chip having a large number of I/O terminals or a semiconductor chip having a small size. In addition, due to the vulnerability, the fan-in semiconductor package may not be directly mounted on a main board of an electronic device. Although the size and spacing of the I/O terminals of the semiconductor chip are enlarged by a rewiring process, the I/O terminals may not have a size and spacing enough to be directly mounted on the main board of the electronic device.

Figure 19:
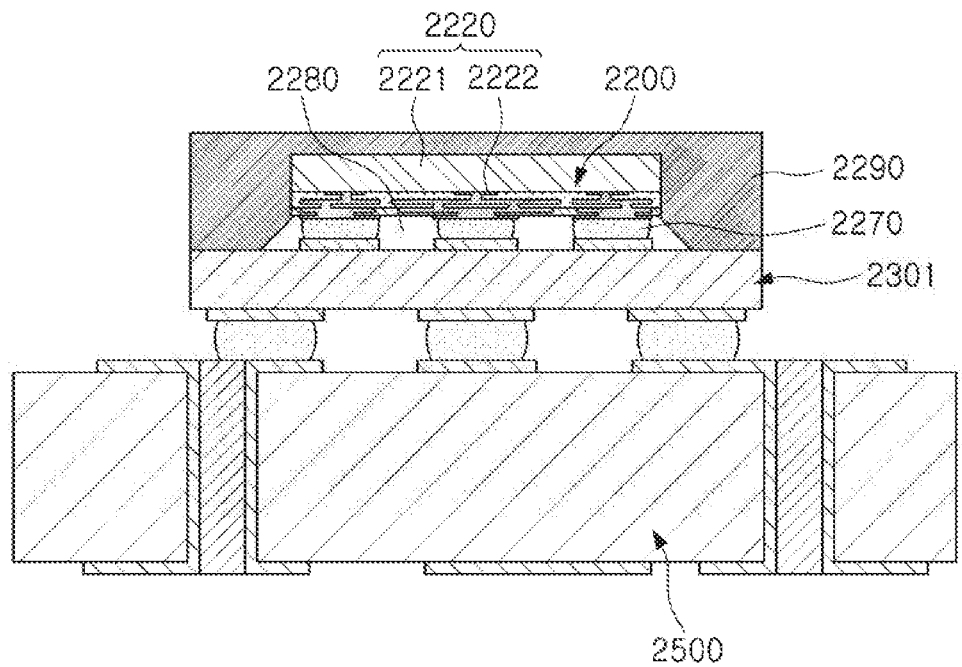
FIG. 19 is a cross-sectional view schematically illustrating a case where a fan-in semiconductor package is mounted on an interposer substrate and ultimately mounted on a main board of an electronic device.

FIG. 19 is a cross-sectional view schematically illustrating a case where a fan-in semiconductor package is mounted on an interposer substrate and ultimately mounted on a main board of an electronic device.

Figure 20:
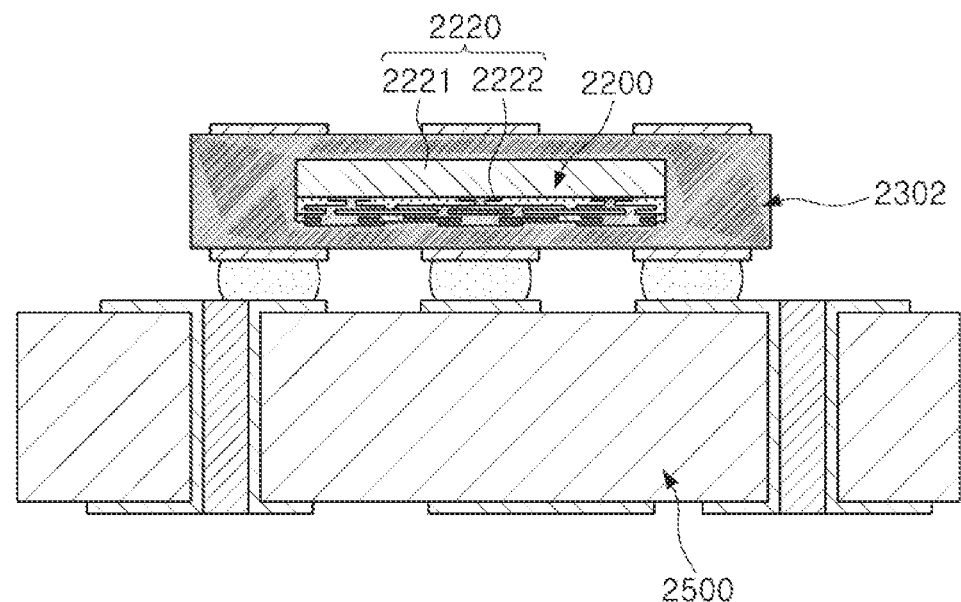
FIG. 20 is a cross-sectional view schematically illustrating a case where a fan-in semiconductor package is embedded in an interposer substrate and ultimately mounted on a main board of an electronic device.

FIG. 20 is a cross-sectional view schematically illustrating a case where a fan-in semiconductor package is embedded in an interposer substrate and ultimately mounted on a main board of an electronic device.

Referring to FIGS. 19 and 20, the connection pads 2222, that is, the I/O terminals, of the semiconductor chip 2220 of the fan-in semiconductor package 2200 are re-wired again through an interposer substrate 2301 and the fan-in semiconductor package 2200 mounted on the interposer substrate 2301 may ultimately be mounted on a main board 2500 of an electronic device. Here, the electrical connection structure 2270, and the like, may be fixed by an underfill resin 2280, and the like, and the outer side may be covered with a molding material 2290, or the like. Alternatively, the fan-in semiconductor package 2200 may be embedded in a separate interposer substrate 2302, the connection pads 2222, i.e., the I/O terminals, of the semiconductor chip 2220 may be re-wired again by the interposer substrate 2302 in the embedded state, and the fan-in semiconductor package 2200 may ultimately be mounted on the main board 2500 of the electronic device.

In this manner, since the fan-in semiconductor package is difficult to be directly mounted on the main board of the electronic device, the fan-in semiconductor package may be mounted on the separate interposer substrate and then mounted on the main board of the electronic device through a packaging process again or may be embedded in the interposer substrate and mounted on the main board of the electronic device.

Figure 21:
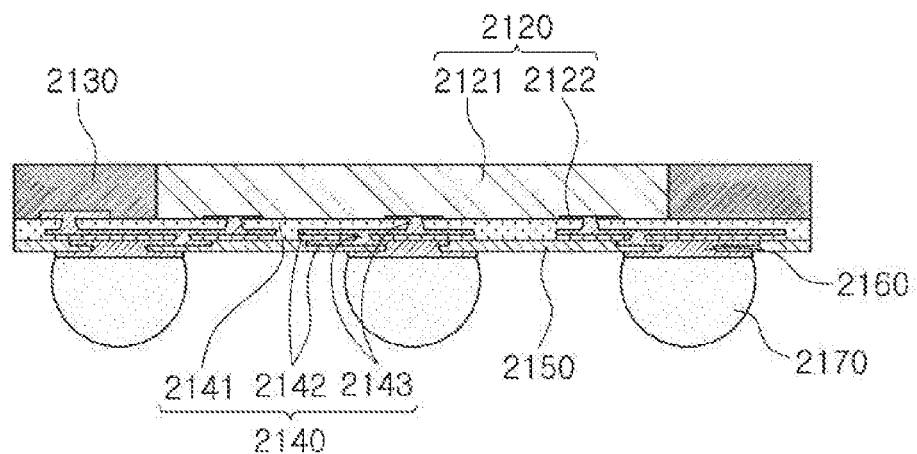
FIG. 21 is a schematic cross-sectional view of a fan-out semiconductor package.

FIG. 21 is a cross-sectional view illustrating a schematic view of a fan-out semiconductor package.

Referring to FIG. 21, in the fan-out semiconductor package 2100, for example, the outer side of a semiconductor chip 2120 is protected by an encapsulant 2130, and the connection pads 2122 of the semiconductor chip 2120 are re-wired to the outer side of the semiconductor chip 2120 by the connection member 2140. Here, a passivation layer 2150 may further be formed on the connection member 2140, and an underbump metallization layer 2160 may further be formed in an opening of the passivation layer 2150. An electrical connection structure 2107 may further be formed on an underbump metallization layer 2160. The semiconductor chip 2120 may be an IC including a body 2121, a connection pad 2122, a passivation film (not shown), and the like. The connection member 2140 may include an insulating layer 2141, a re-wiring layer 2142 formed on the insulating layer 2241, and a via 2143 electrically connecting the connection pad 2122 and the re-wiring layer 2142.

As described above, the fan-out semiconductor package is in a form that the I/O terminals are re-wired and disposed even on the outer side of the semiconductor chip through the connection member formed on the semiconductor chip. As described above, in the fan-in semiconductor package, all the I/O terminals of the semiconductor chip must be disposed inside the semiconductor chip, and thus, if a device size is reduced, a ball size and pitch must be reduced, and as a result, a standardized ball layout may not be used. In contrast, in the fan-out semiconductor package, since the I/O terminals are re-wired and disposed even on the outer side of the semiconductor chip through the connection member formed on the semiconductor chip, although the size of the semiconductor chip is reduced, the standardized ball layout may be used as is. Therefore, the fan-out semiconductor package may be mounted on a main board of an electronic device even without a separate interposer substrate as described hereinafter.

Figure 22:
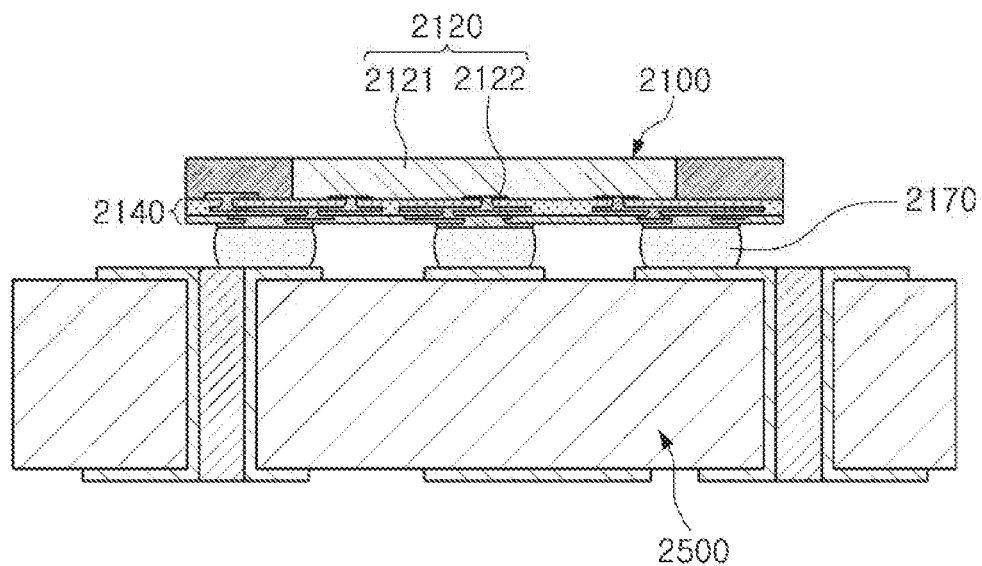
FIG. 22 is a cross-sectional view schematically illustrating a case where a fan-out semiconductor package is mounted on a main board of an electronic device.

FIG. 22 is a cross-sectional view schematically illustrating a case where a fan-out semiconductor package is mounted on a main board of an electronic device.

Referring to FIG. 22, the fan-out semiconductor package 2100 may be mounted on the main board 2500 of the electronic device through the electrical connection structure 2170, and the like. That is, as described above, the fan-out semiconductor package 2100 may include the connection member 2140 which may re-wire the connection pad 2122 to a fan-out area beyond the size of the semiconductor chip 2120, on the semiconductor chip 2120, the standardized ball layout may be used as is, and as a result, the fan-out semiconductor package 2100 may be mounted on the main board 2500 of the electronic device even without a separate interposer substrate, or the like.

In this manner, since the fan-out semiconductor package may be mounted on the main board of the electronic device even without a separate interposer substrate, a thickness of the fan-out semiconductor package may be smaller than that of the fan-in semiconductor package using an interposer substrate, achieving a small size and a small thickness. In addition, since the fan-out semiconductor package has excellent thermal properties and electrical properties, it is particularly suitable for mobile products. In addition, the fan-out semiconductor package may be realized to be more compact than a general package-on-package (POP) type using a PCB and solve a problem caused due to a bowing phenomenon.

Meanwhile, the fan-out semiconductor package refers to a package technology for mounting a semiconductor chip on a main board of an electronic device and for protecting the semiconductor chip from an external impact and has a concept different from a PCB such as an interposer substrate which are different in scale, purpose, and the like, and having a fan-in semiconductor package embedded therein.

As set forth above, since the antenna module according to exemplary embodiments in the present disclosure has a structure in which the antenna, the IC, and the filter are integrated efficiently, the antenna module has a high level of antenna performance and may be easily miniaturized.

In the antenna module according to an exemplary embodiment in the present disclosure, since the structure of the space in which the filter is disposed may be diversified, the antenna module may have various types/numbers of filters.

In the antenna module according to an exemplary embodiment in the present disclosure, since electromagnetic shielding performance of the space where the filter is disposed is improved, filtering performance of the filter may be improved.

In the antenna module according to an exemplary embodiment in the present disclosure, since the filter may be adjacent to the path of the IF signal or the baseband signal, filtering efficiency of the filter may be improved.

The antenna module according to an exemplary embodiment in the present disclosure may be miniaturized, while ensuring performance of the reference antenna, as the necessity of a filter for an RF signal corresponding to each of the plurality of antenna members is reduced.

While exemplary embodiments have been shown and described above, it will be apparent to those skilled in the art that modifications and variations could be made without departing from the scope of the present disclosure as defined by the appended claims.

What is claimed is:

1. An antenna module comprising:
a connection member including at least one wiring layer and at least one insulating layer;
an antenna package including a plurality of antenna members configured to transmit or receive a radio frequency (RF) signal and a plurality of feed vias respectively electrically connected to the plurality of antenna members at a first end and respectively electrically connected to a wiring corresponding to the at least one wiring layer at a second end, and positioned on a first surface of the connection member;
an integrated circuit (IC) disposed on a second surface of the connection member and electrically connected to the wiring corresponding to the at least one wiring layer, the IC being configured to receive an intermediate frequency (IF) signal or a baseband signal and transfer the RF signal or receive the RF signal and transfer the IF signal or the baseband signal;
a support member disposed on the second surface of the connection member and comprising at least one core wiring layer; and
a filter disposed outside of the IC and included in the at least one core wiring layer, the filter being configure to filter the IF signal or the baseband signal.

2. The antenna module of claim 1, wherein the support member is electrically connected to the wiring corresponding to the at least one wiring layer to allow the IF signal or the baseband signal to pass through the support member.

3. The antenna module of claim 2, wherein
the support member includes a core via electrically connected to the wiring corresponding to the at least one wiring layer at one end, the at least one core wiring layer, and at least one core insulating layer.

4. The antenna module of claim 3, wherein
the support member further includes an upper wiring layer disposed on top of the at least one core wiring layer and a lower wiring layer disposed on a bottom of the at least one core wiring layer,
the upper wiring layer includes an upper ground pattern overlapping the filter, and
the lower wiring layer includes a lower ground pattern overlapping the filter.

5. The antenna module of claim 2, wherein
the support member further includes a core plating member disposed on a side surface of the support member in a direction toward the IC, and
the filter is disposed in the support member.

6. The antenna module of claim 1, further comprising:
an encapsulant encapsulating at least a portion of the IC and at least a portion of the filter,
wherein the IC has an active surface in contact with the connection member and an inactive surface exposed to the encapsulant, and
the filter is disposed on the second surface of the connection member.

7. The antenna module of claim 1, wherein
the antenna package further includes a dielectric layer disposed to surround each of the plurality of feed vias and having a thickness greater than a thickness of the at least one insulating layer.

8. The antenna module of claim 1, wherein the antenna package further includes a plating member disposed to surround each of the plurality of feed vias.

9. The antenna module of claim 1, further comprising:
a second filter disposed outside of the IC and having a pass band of a frequency lower than that of a pass band of the filter; and
a third filter disposed outside of the IC and having a pass band of a frequency higher than that of the pass band of the filter.

10. An antenna module comprising:
an integrated circuit (IC) having an active surface with connection pads disposed thereon;
a connection member disposed on the active surface of the IC, the connection member comprising a wiring layer electrically connected to the connection pads, and an insulating layer;
an antenna package disposed on the connection member, the antenna package comprising antenna members configured to transmit and/or receive a radio frequency (RF) signal, and a plurality of feed vias each having a first end electrically connected to one of the antenna members and a second end electrically connected to the wiring layer;
a filter disposed outside the IC, the filter being configured to filter an intermediate frequency (IF) signal and/or a baseband signal; and
a support member surrounding the IC and comprising a core wiring layer, the connection member being disposed on the support member,
wherein the filter is included in the core wiring layer.

11. The antenna module of claim 10, wherein the IC is configured to receive the IF signal or the baseband signal and transfer the RF signal, or receive the RF signal and transfer the IF signal or the baseband signal.

12. The antenna module of claim 10, further comprising:
a support member surrounding the IC, the connection member being disposed on the support member.

13. The antenna module of claim 12, wherein the support member comprises:
a first wiring layer disposed on a first surface of the support member on which the connection member is disposed,
a second wiring layer disposed on a second surface of the support member opposite the first surface, and
a core via electrically connecting the first wiring layer and the second wiring layer.

14. The antenna module of claim 13, wherein the support member further comprises:
a core insulating layer disposed on the first surface.

15. The antenna module of claim 13, wherein the first wiring layer includes a first ground pattern overlapping the filter, and the second wiring layer includes a second ground pattern overlapping the filter.

16. The antenna module of claim 12, wherein the support member comprises a cavity in which the IC is disposed, a core plating member being disposed on side walls of the cavity.

17. The antenna module of claim 12, further comprising a passive component disposed in the support member and electrically connected to the wiring layer of the connection member.

18. The antenna module of claim 10, wherein the antenna package further comprises
a dielectric layer disposed to surround each of the plurality of feed vias and having a thickness greater than a thickness of the insulating layer of the connection member.

19. The antenna module of claim 10, wherein the antenna package further comprises
a plating member disposed to surround each of the feed vias.

* * * * *